United States Patent
Kim et al.

(10) Patent No.: US 6,448,661 B1
(45) Date of Patent: Sep. 10, 2002

(54) THREE-DIMENSIONAL MULTI-CHIP PACKAGE HAVING CHIP SELECTION PADS AND MANUFACTURING METHOD THEREOF

(75) Inventors: Hyeong-Seob Kim, Chungcheongnam-do; Sa-Yoon Kang, Seoul; Myung-Kee Chung, Chungcheongnam-do; In-Ku Kang, Chungcheongnam-do; Kwan-Jai Lee, Chungcheongnam-do, all of (KR)

(73) Assignee: Samsung Electornics Co., Ltd., Hwasung (KR)

( * ) Notice: Subject to any disclaimer, the term of this patent is extended or adjusted under 35 U.S.C. 154(b) by 0 days.

(21) Appl. No.: 10/059,932

(22) Filed: Jan. 28, 2002

(30) Foreign Application Priority Data

Feb. 9, 2001 (KR) .......................................... 2001-6318

(51) Int. Cl.[7] ..................... H01L 23/48; H01L 23/52; H01L 29/40
(52) U.S. Cl. ...................... 257/777; 257/686
(58) Field of Search ................... 257/777, 685, 257/686, 778; 361/803, 767, 768, 784; 438/109, 110, 108

(56) References Cited

U.S. PATENT DOCUMENTS

| | | | | |
|---|---|---|---|---|
| 4,996,583 A | * | 2/1991 | Hatada | |
| 5,585,675 A | * | 12/1996 | Knoopf | |
| 5,910,685 A | * | 6/1999 | Watanabe et al. | |
| 5,973,396 A | * | 10/1999 | Farnworth | |
| 5,995,379 A | * | 11/1999 | Kyougoku et al. | |
| 6,043,438 A | * | 3/2000 | Peterson | |
| 6,064,114 A | * | 5/2000 | Higgins, III | |
| 6,130,823 A | * | 10/2000 | Lauder et al. | |
| 6,222,278 B1 | * | 4/2001 | Miyamoto et al. | |
| 6,239,495 B1 | * | 5/2001 | Sakui et al. | |
| 6,340,845 B1 | * | 1/2002 | Oda | |
| 6,355,976 B1 | * | 3/2002 | Faris | |
| 6,369,447 B2 | * | 4/2002 | Mori | |
| 6,381,141 B2 | * | 4/2002 | Corisis et al. | |

FOREIGN PATENT DOCUMENTS

JP          10-163420        * 6/1998

* cited by examiner

Primary Examiner—Sheila V. Clark
(74) Attorney, Agent, or Firm—Marger Jonson & McCollom, P.C.

(57) ABSTRACT

A three-dimensional, multi-chip package with chip selection pads formed at the chip-level and a manufacturing method thereof are provided. The three-dimensional, multi-chip package is formed by stacking a number (N) of semiconductor integrated circuit chips. Each chip comprises an integrated circuit die, a chip selection terminal, (N−1) chip selection pads, an insulation layer, (N−1) metal wirings, upper connection terminals, lower connection terminals, and trench wirings. The chip selection terminal of each chip is separated from the chip selection of the other chips by the chip selection pads formed at the chip-level.

14 Claims, 9 Drawing Sheets

THREE-DIMENSIONAL MULTI-CHIP PACKAGE HAVING CHIP SELECTION PADS AND MANUFACTURING METHOD THEREOF

BACKGROUND OF THE INVENTION

1. Field of the Invention

The present invention relates to semiconductor packaging technology and, more particularly, to a three-dimensional, multi-chip package with chip selection pads and a manufacturing method thereof.

2. Description of the Related Art

In order to satisfy the pressing demands for increased integration and multi-functionality, various three-dimensional multi-chip packages have recently been developed. A conventional three-dimensional multi-chip package is manufactured as described below. After manufacturing a wafer and separating the wafer into a plurality of individual chips, the chip is attached and electrically connected to the substrate, and is encapsulated with a molding resin to produce a package. Then, a multi-chip package is obtained by stacking the packages.

These multi-chip packages employ a lead frame, or a substrate such as a tape circuit board or a printed circuit board. Various interconnection methods such as a wire-bonding method, tape automated bonding (TAB) method, or flip chip-bonding method, are employed to establish electrical connection between the chip and the substrate.

The multi-chip packages formed by stacking a plurality of packages are disclosed in U.S. Pat. Nos. 4,982,265, 4,996,583, 5,172,303, 5,198,888, 5,222,014, 5,247,423, 5,313,096, 5,783,870 and 6,072,233. However, these multi-chip packages are manufactured using complex processes. Moreover, these multi-chip packages have much bigger sizes than the standard chip, thereby reducing the mounting density on the external apparatus. Further, since the multi-chip packages employ substrates, they cause long signal transmission routes and thereby signal delay results.

While three-dimensional multi-chip packages on wafer-level or chip-level are disclosed in U.S. Pat. Nos. 4,394,712, 4,807,021, 4,897,708, 4,954,875, 5,202,754, 5,229,647 and 5,767,001. These multi-chip packages have the advantage of simple structures, smaller sizes, and simple manufacturing processes. Further, a multi-chip package at the wafer-level prevents signal delay. However, this technique is applied only to non-memory devices such as Application Specific Integrated Circuit (ASIC) or to multi-chip packages with multiple functions by stacking different types of chips.

Generally, multi-chip packages are classified into two types. One is a multi-chip package formed by stacking different types of chips, thereby achieving multi-functionality. The other is a multi-chip package formed by stacking the same types of chips, thereby improving memory capacity.

In order to improve memory capacity by stacking the same types of chips, there must be a chip selection mechanism to operate the desired chip. Therefore, each memory chip comprises a chip selection terminal. For example, in case of a DRAM chip, the Row Address Strobe (RAS), Column Address Strobe (CAS) or Chip Selection Pin (CSP) is used as the chip selection terminal. By selectively transmitting electronic signals to the specific chip selection terminal corresponding to the desired chip of the multi-chip package, the desired chip is selected for operation. Other non-selecting terminals of the memory chips in the multi-chip package are commonly connected together, but the chip selection terminal for each individual chip are isolated and connected to an external electronic component.

The conventional technique for separating the chip selection terminals of each chip from one another is disclosed in the above-described multi-chip package. That is, the chip selection terminal of each chip is connected to an external electronic component through connection wirings formed on a substrate of the package. Therefore, in order to separate the chip selection terminal of each chip from one another, each substrate should comprise a connection wiring configuration different from the other substrates, thereby increasing the production cost and reducing productivity.

The drawbacks are prevented by a conventional technique disclosed in U.S. Pat. No. 5,995,379. In this patent, the chip selection terminal of each chip is connected to external electronic components by a substrate with the same connection wiring configuration as the substrate of the other chips. However, since this technique is applied to a multi-chip package by stacking packages, it requires substrates on which connection wirings are formed. Therefore, this technique also has the previously described drawbacks of stacked, multi-chip packages such as large package size, reduced mounting density, complex manufacturing processes, and signal delay.

SUMMARY OF THE INVENTION

The present invention increases memory capacity by providing a multi-chip package formed by stacking at least two of the same types of chips.

The present invention provides a multi-chip package at the wafer-level, thereby reducing package size, increasing mounting density, and preventing signal delay.

The present invention separates the chip selection terminal of each chip from one another via chip selection pads formed at the chip-level. The present invention simplifies the manufacturing process of the multi-chip package.

According to one embodiment, a three-dimensional, multi-chip package is formed by stacking a number (N) of semiconductor integrated circuit chips. Each chip comprises an integrated circuit die, a chip selection terminal, a number (N−1) of chip selection pads, an insulation layer, a number (N−1) of metal wirings, upper connection terminals, lower connection terminals, and trench wirings.

The chip selection terminal and the chip selection pads are formed on an upper surface of the die, and the chip selection pads are proximate to the chip selection terminal. The insulation layer is formed on the upper surface of the die, and the metal wirings are formed within the insulation layer and connected to the chip selection pads. The upper connection terminals are formed on the insulation layer and connected to the metal wiring. The lower connection terminals are formed on the lower surface of the die, and each of the lower connection terminals is connected to a corresponding one of the chip selection terminal and the chip selection pads. The trench wirings extend through the die, and connect the chip selection terminal and the chip selection pads to the lower connection terminals.

Among the chip selection pads, a first chip selection pad next to the chip selection terminal is connected to the upper connection terminal formed above the chip selection terminal, and the (N−1)th chip selection pad is connected to the upper connection terminal formed above the (N−2)th chip selection pad. The individual chips are stacked by attaching the upper connection terminals of a lower chip to the lower connection terminals of an upper chip. The chip selection terminal of each chip is connected to a corresponding one of the lower connection terminals of a lowermost chip.

Further, the present invention provides a method of manufacturing a chip-level, three-dimensional, multi-chip package by stacking a number (N) of semiconductor integrated circuit chips.

In accordance with the method of the present invention, a chip selection terminal and a number (N−1) of chip selection pads close to the chip selection terminal are formed on the upper active surface of the chip, and a plurality of trenches from the chip selection terminal and the chip selection pads are formed within the chip. Then, trench wirings are formed by filling the trenches with a conductive material, and a number (N−1) of first metal wirings formed along the upper surface of the chip, each of the first metal wirings are connected to a corresponding one of the chip selection pads. A first insulation layer is formed on the upper surface of the chip and the first metal wirings, and a plurality of upper connection terminals connected to the first metal wirings are formed on the first insulation layer. The lower surface of the chip is grinded so that the trench wirings are exposed through the lower surface of the chip. A plurality of lower connection terminals are formed on the lower surface of the chip, with each of the lower connection terminals being connected to a corresponding one of the trench wirings. The chips are stacked by attaching the upper connection terminals of a lower chip to the lower connection terminals of an upper chip.

BRIEF DESCRIPTION OF THE DRAWINGS

These and other objects, features, and advantages of the present invention will be readily understood with reference to the following detailed description provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
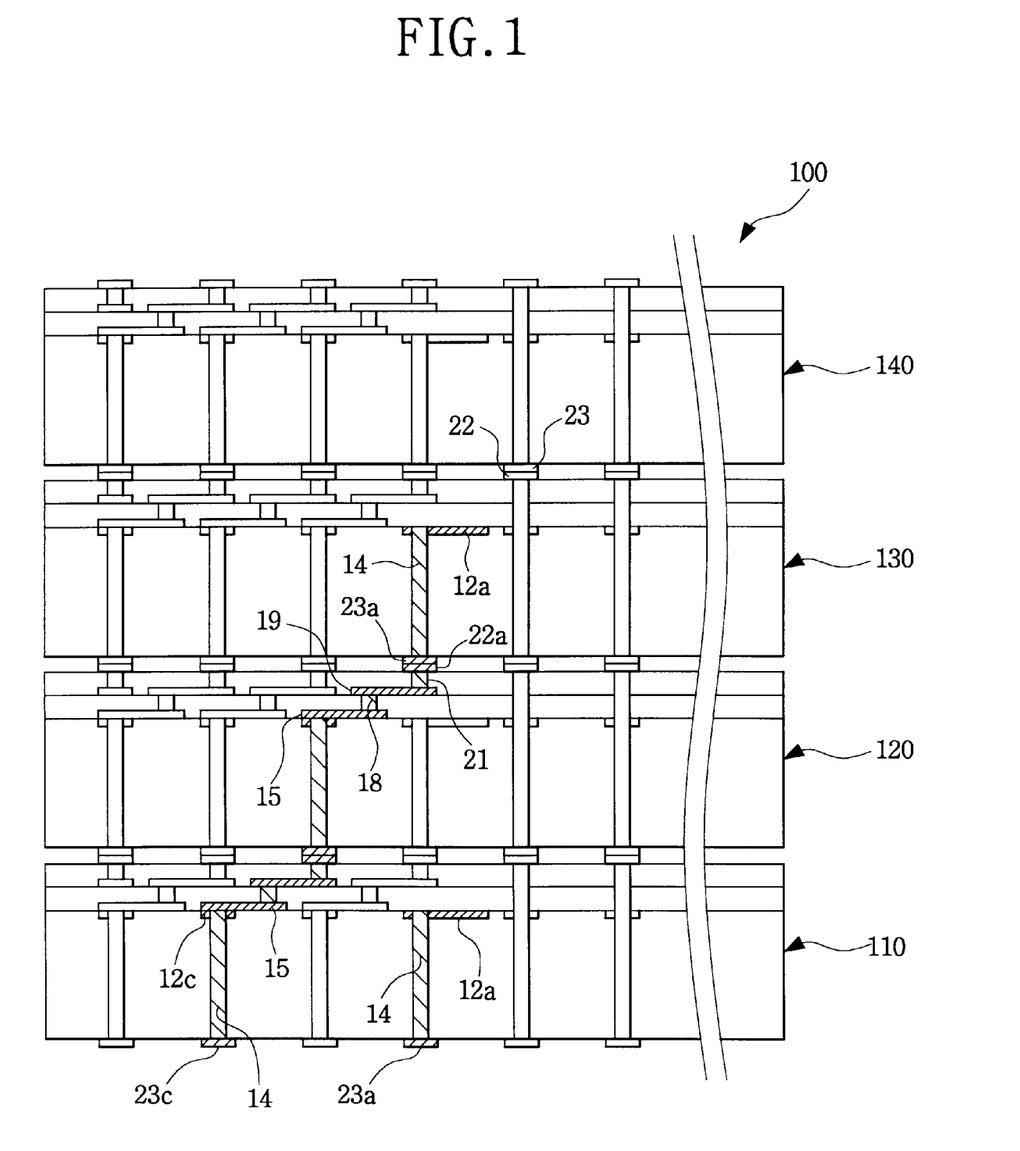
FIG. 1 is a cross-sectional view of a three-dimensional, multi-chip package in accordance with an embodiment of the present invention.
Figure 2:
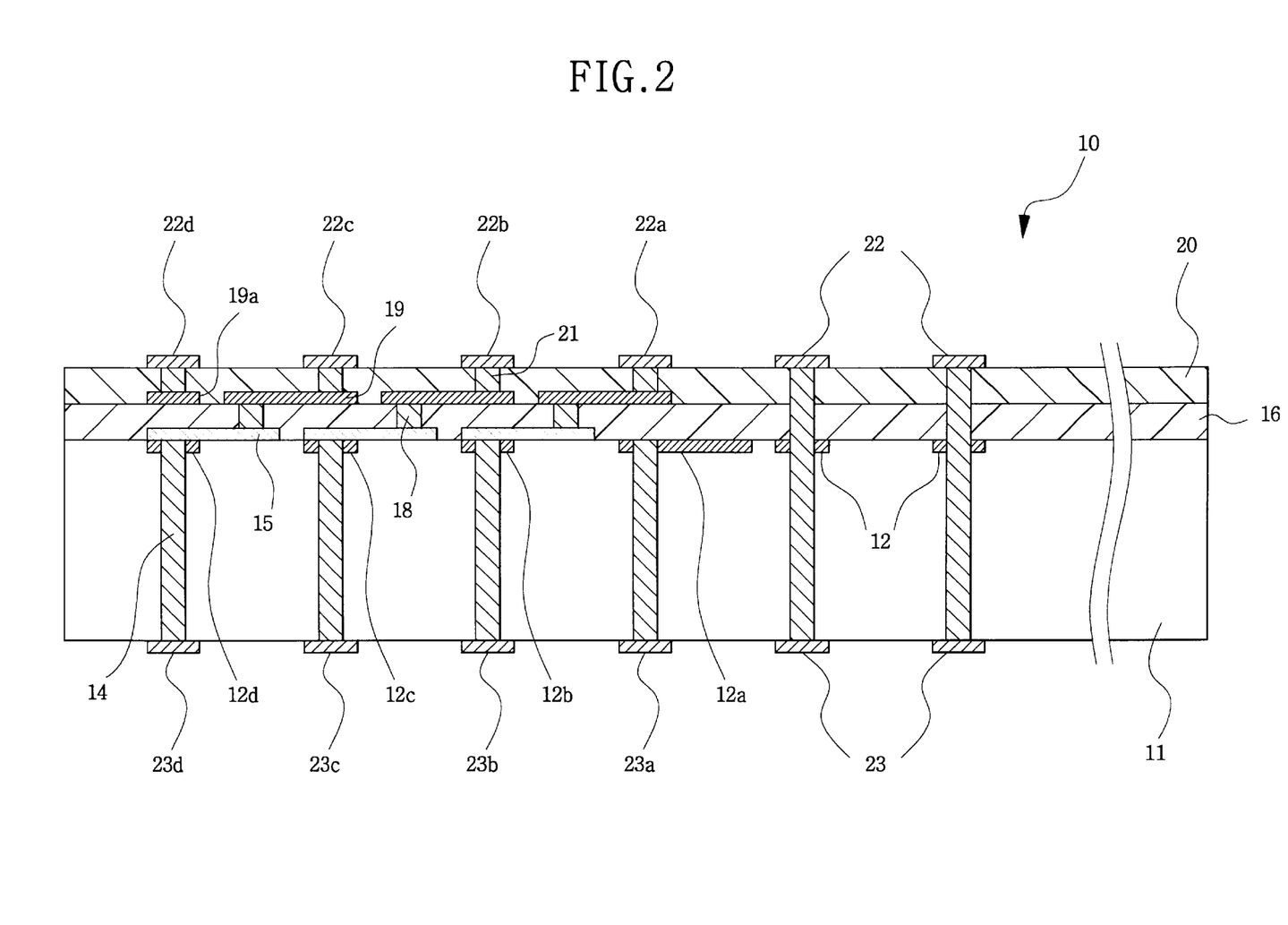
FIG. 2 is a cross-sectional view of an individual semiconductor integrated circuit chip used in the three-dimensional, multi-chip package of FIG. 1.

FIG. 1 is a cross-sectional view of a chip-level, three-dimensional, multi-chip package in accordance with one embodiment of the present invention, and FIG. 2 is a cross-sectional view of an individual semiconductor integrated circuit chip used in the chip-level, three-dimensional, multi-chip package. With reference to FIGS. 1 and 2, a first embodiment of the present invention is described below.

In order to improve memory capacity, a chip-level three-dimensional multi-chip package 100 of FIG. 1 is formed by stacking four (4) of the same types of semiconductor integrated circuit chips 10 in FIG. 2. Reference numerals 110, 120, 130 and 140 in FIG. 1 each represent individual integrated circuit chips.

The chips 10, 110, 120, 130 and 140 are memory chips such as DRAM chips or flash memory chips. It is well known that a memory chip comprises address input terminals for addressing memory cells, data input/output terminals for inputting/outputting data to/from the memory cells, and power supply terminals. The chip terminals 12 of the chips are interconnected to one another, while the chip selection terminal 12a of one chip is separated from another chip selection terminal 12a of another chip and connected to an external environment.

As shown in detail in FIG. 2, the chip 10 comprises a die 11. Herein, the die 11 is a die on wafer-level or a die individually separated (singulated) from a wafer. A plurality of chip terminals 12 and a chip selection terminal 12a are formed on an upper active surface of the die 11. Integrated circuits (not shown) are formed within the die 11 and connected to the chip terminals 12 and the chip selection terminal 12a.

The chip 10 comprises three (3) chip selection pads 12b, 12c, 12d. The chip selection pads 12b, 12c, 12d are formed on the upper surface of the die 11 close or adjacent to the chip selection terminal 12a. Herein, the number of the chip selection pads is one less than the total number of stacked chips 10. For example, if the multi-chip package is formed by stacking a number (N) of chips, a number (N−1) of chip selection pads are required. The chip selection pads 12b, 12c, 12d are not connected to the integrated circuits within the die 11.

First metal wirings 15 are formed on the upper surface of the die 11 and the chip selection pads 12b, 12c, and 12d, with each chip selection pad connected to a corresponding one of the first metal wirings 15. A first insulation layer 16 is formed on the upper surface of die 11. Thus, the first metal wirings 15 are formed within the first insulation layer 16. The first metal wirings 15 extend toward the chip selection terminal 12a and electrically separated from one another. Each of the chip selection pads 12b, 12c, and 12d is connected to a corresponding one of the lower connection terminals 23b, 23c, and 23d formed on the lower surface of die 11 by trench wirings 14 perforating or extending through the die 11. The chip selection terminal 12a and the chip terminals 12 are electrically connected to the lower connection terminals 23a and 23, respectively, through the trench wirings 14.

A second insulation layer 20 is formed on the upper surface of the first insulation layer 16. Second metal wirings 19, 19a are formed within the second insulation layer 20. The second metal wirings 19, 19a are electrically connected to the first metal wirings 15 through first through wirings 18 formed within the first insulation layer 16. The second metal wirings 19, 19a extend toward the chip selection terminal 12a and are electrically separated from one another. The second metal wiring 19 connected to the first chip selection pad 12b next to the chip selection terminal 12a is disposed above the chip selection terminal 12a, and the second metal wiring 19 connected to the second chip selection pad 12c is disposed above the first chip selection pad 12b. The second metal wiring 19 connected to the third chip selection pad 12d is disposed above the second chip selection pad 12c. The isolated second metal wiring 19a is disposed above the third chip selection pad 12d.

Second through wirings 21 are formed within the second insulation layer 20 and connected to the second metal wirings 19, 19a. Upper connection terminals 22a, 22b, 22c, 22d are formed on the second insulation layer 20 and connected to the second through wirings 21.

Upper connection terminals 22 are formed on the second insulation layer 20, and connected to the chip terminals 12. Herein, in order to electrically connect the chip terminal 12 to the corresponding upper connection terminal 22 and to the corresponding lower connection terminal 23, the trench wiring 14, the first through wiring 18, and the second through wiring 21 all are formed on the same position. Thus, the first selection pad 12b is connected to the upper connection terminal 22a, and the second selection pad 12c is connected to the upper connection terminal 22b. The third selection pad 12d is connected to the upper connection terminal 22c. The upper connection terminal 22d is connected to the isolated second metal wiring 19a, and is therefore not connected to any of the chip selection pads 12b, 12c, 12d.

The multi-chip package 100 in FIG. 1 is obtained by stacking a plurality of the semiconductor integrated circuit chips 10, each chip having the above-described configuration. One chip 10 is connected to another chip by the attachment between the upper connection terminals 22, 22a–22d and the lower connection terminals 23, 23a–23d. That is, the upper connection terminals of a lower chip are attached to the lower connection terminals of an upper chip.

The lower connection terminals 23, 23a–23d of the lowermost chip 110 serve as external terminals of the multi-chip package 100 and are attached to an external device such as a mother board (not shown). In order to easily attach the lower connection terminals 23, 23a–23d to the mother board, metal bumps or solder balls may be formed on the lower connection terminals 23, 23a–23d. In the same manner, in order to effectively stack the chips 110, 120, 130, 140 to one another, metal bumps or solder balls may be formed on both/either the upper connection terminals 22, 22a–22d and/or the lower connection terminals 23, 23a–23d.

The chip selection terminal 12a of each chip 110, 120, 130, 140 is connected to a corresponding one of the lower connection terminals 23a–23d of the lowermost chip 110. As shown in FIG. 1, the chip selection terminal 12a of the first chip 110, i.e. the lowermost chip 110, is connected to the first lower connection terminals 23a by the trench wiring 14. The chip selection terminal 12a of the third chip 130 is connected to the third lower connection terminals 23c by passing through the third, the second and the first chip 130, 120, 110.

In order to separate the chip selection terminal of one chip from the chip selection terminals of other chips, the multi-chip package in this embodiment of the present invention does not require that each chip have a different connection-wiring configuration. Although the three-dimensional multi-chip package of the present invention comprises a plurality of stacked chips, each chip with the same structure, the chip selection terminal of each chip is automatically separated from those of other chips. Also, the chip selection pads are formed at the chip-level. That is, the chip selection pads are formed directly on the integrated circuit chip. Since the multi-chip package of the present invention does not require any additional substrate for forming the chip selection pads, the present invention can achieve chip-level, multi-chip packages. The present invention minimizes package size and improves mounting density, thus preventing signal delay.

FIGS. 3A to 3K are cross-sectional views showing a manufacturing method of the chip-level, three-dimensional, multi-chip package of the present invention. With reference to FIGS. 3A to 3K, the manufacturing method of the chip-level, three-dimensional, multi-chip package of this embodiment is described below.

Figure 3A:
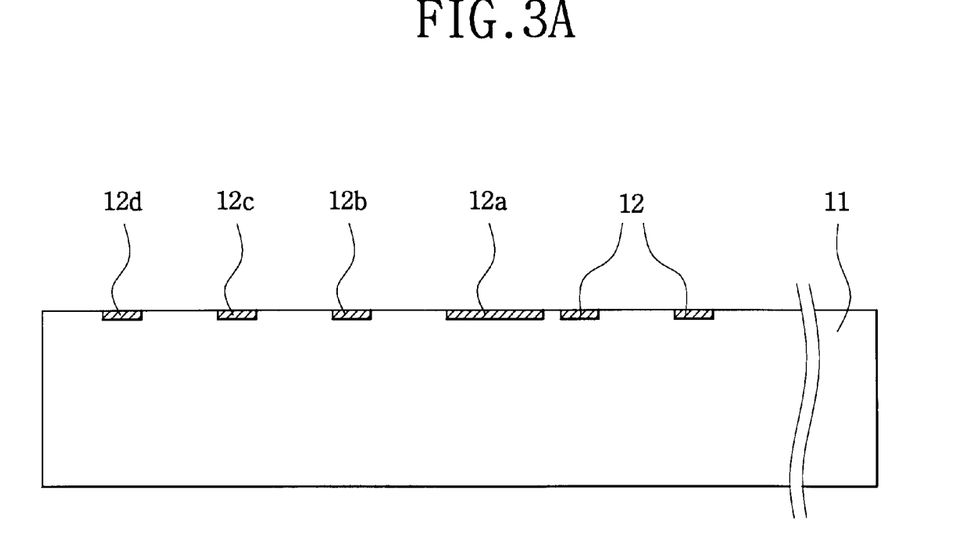
FIGS. 3A to 3K are cross-sectional views showing a manufacturing method of the three-dimensional, multi-chip package of FIG. 1.

As shown in FIG. 3A, a semiconductor integrated circuit die 11 is first fabricated. The die 11 may be one of several dies fabricated on a wafer or an individual die separated from the wafer. As is identical to conventional chips, a plurality of the chip terminals 12 and a chip selection terminal 12a are formed on the upper active surface of the die 11. Three (3) chip selection pads 12b, 12c, 12d are formed on the upper surface of the die 11 close to or proximate to the chip selection terminal 12a. The chip selection pads number one less than the number of stacked chips. The chip terminals 12 and the chip selection terminal 12a are connected to the circuits formed within the die 11, while the chip selection pads 12b, 12c, 12d are not connected to the circuits.

Figure 3B:
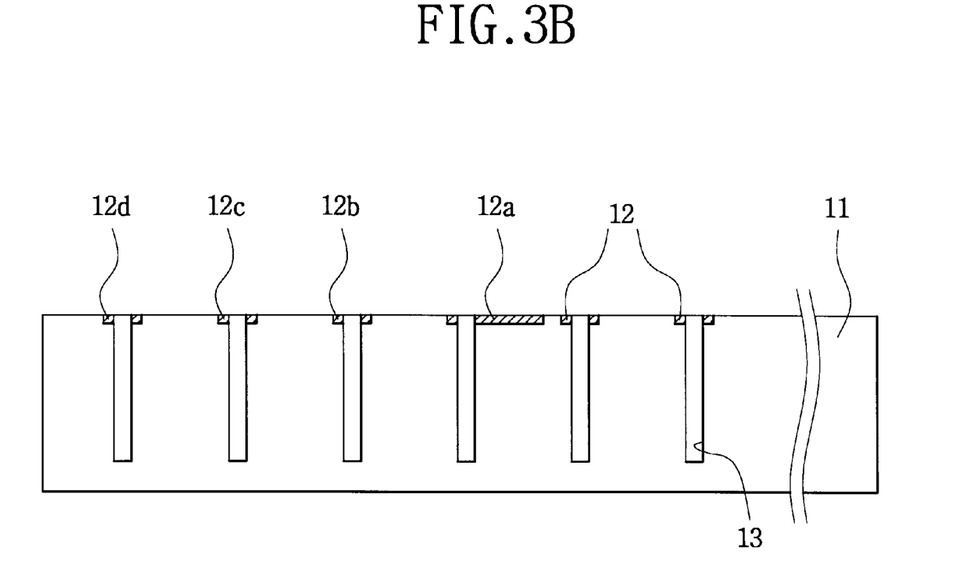

As shown in FIG. 3B, trenches 13, each having a predetermined depth, perforate the die 11 from the chip terminals 12, the chip selection terminal 12a and the chip selection pads 12b, 12c, 12d. The trenches 13 are formed by techniques such as a chemical etching method or a drilling method with a laser drill. The width of the trench 13 is smaller than the widths of the chip terminals 12, the chip selection terminal 12a and the chip selection pads 12b, 12c, 12d.

Figure 3C:
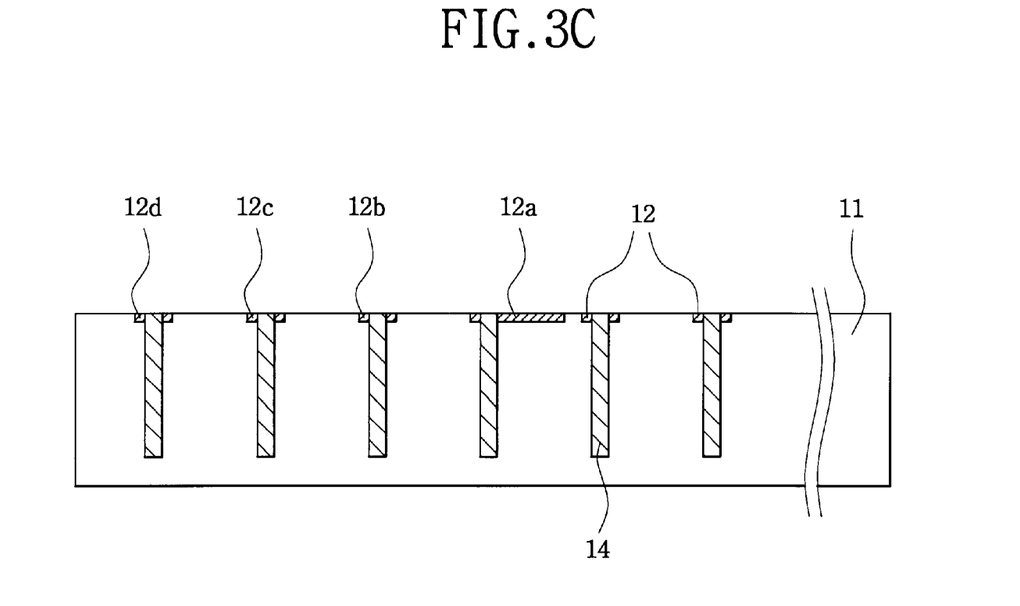

Then, as shown in FIG. 3C, the trenches 13 are filled with a conductive material, forming the trench wirings 14. Preferably, tungsten (W) is used as the conductive material, but other conductive materials may also be used. A conventional deposition technique such as Chemical Vaporization Deposition (CVD) is used in forming the trench wirings 14.

Figure 3D:
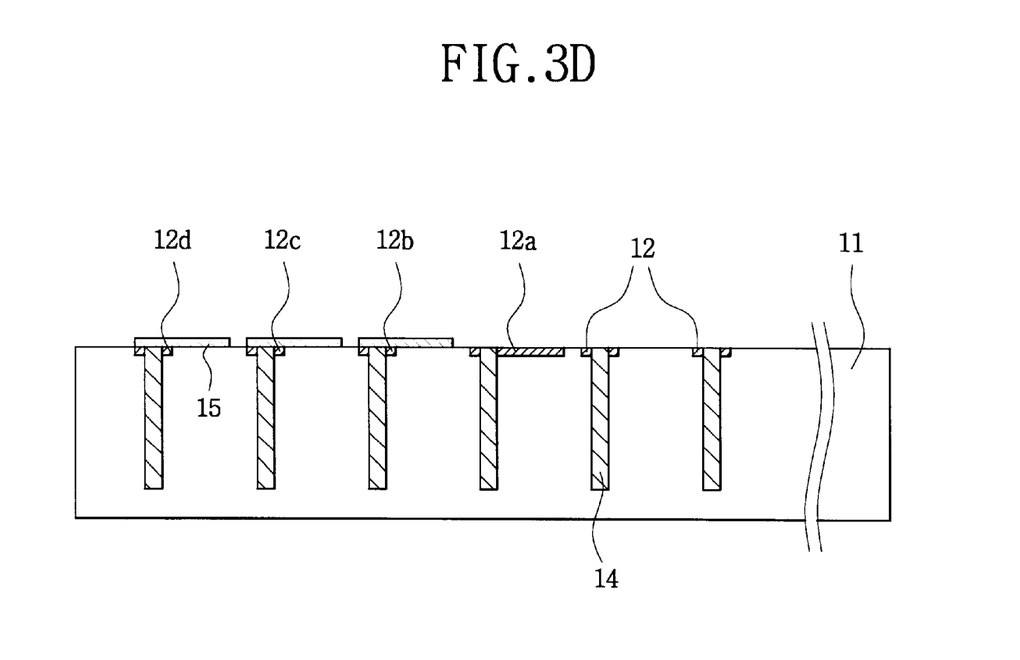

As shown in FIG. 3D, the first metal wirings 15 are formed on the upper surface of the die 11. The first metal wirings 15 are formed on the chip selection pads 12b, 12c, 12d, but not formed on the chip selection terminal 12a and the chip terminals 12. The first metal wirings 15 extend toward the chip selection terminal 12a along the upper surface of the die 11, and are separated from each other. Various metals such as copper (Cu) or tungsten (W) can be used as the first metal wirings 15. A person skilled art will appreciate that other suitable conductive materials can be used in place. The first metal wirings 15 are formed by various methods. For example, a metal layer is deposited on the whole upper surface of the die 11 and is etched using photoresist patterns to form the first metal wirings 15. Also, photoresist patterns are first coated on the upper surface of the die 11, and the metal layer is deposited thereon.

Figure 3E:
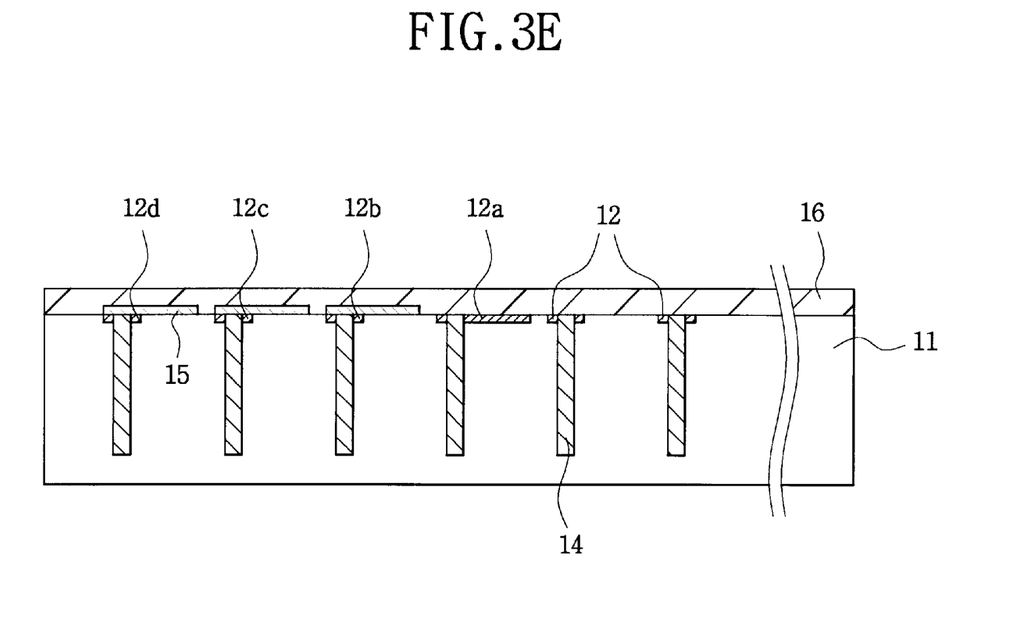

As shown in FIG. 3E, the first insulation layer 16 is formed on the upper surface of the die 11 including the first metal wirings 15. For the first insulation layer 16, an inorganic insulation layer such as a nitride layer or an organic layer such as a polyimide layer or an epoxy layer is used. The inorganic insulation layer is formed by a conventional deposition method, and the organic insulation layer is formed by a conventional spin coating method.

Figure 3F:
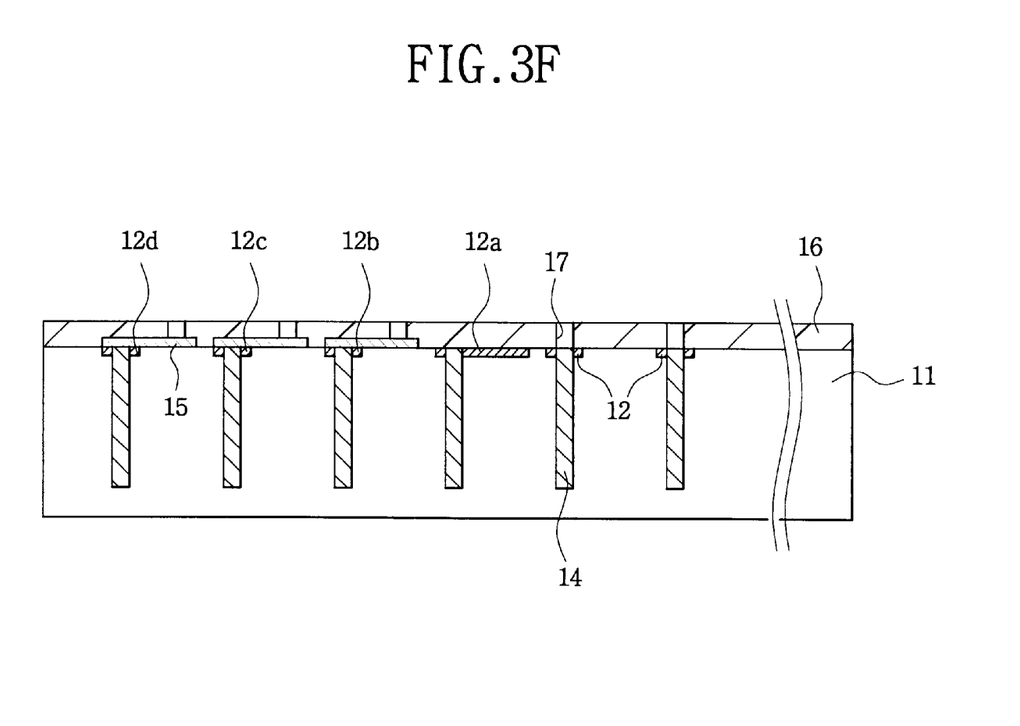

As shown in FIG. 3F, through holes 17 are formed by partially removing the first insulation layer 16. The through holes 17 are formed by a conventional photolithography method. The through holes 17 are disposed on the chip terminals 12 and the first metal wirings 15. The through holes 17 on the first metal wirings 15 are disposed between the neighboring trench wirings 14. One end of each first metal wiring 15 is connected to a corresponding one of the chip selection pads 12b, 12c, 12d and the other end is connected to the through hole 17.

Figure 3G:
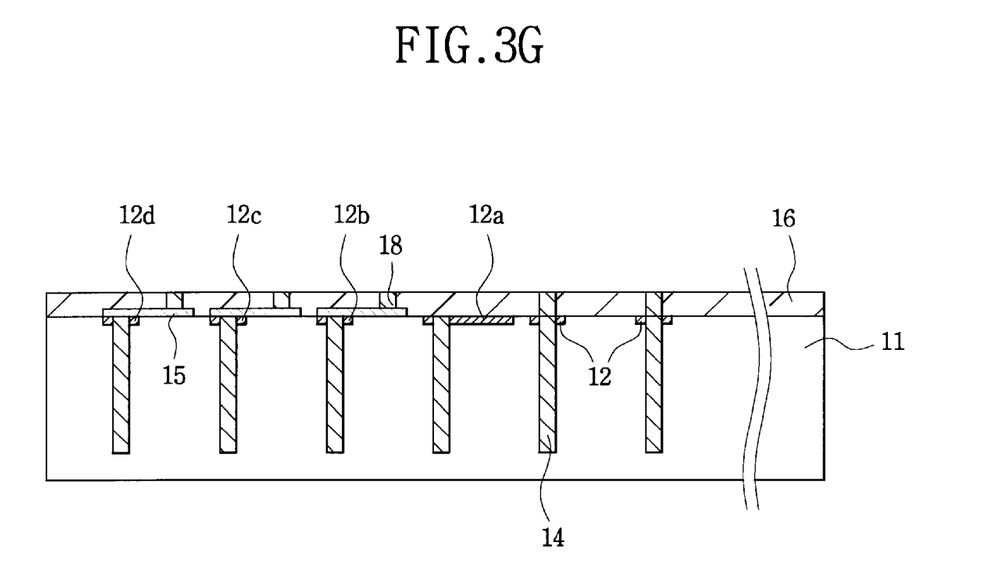

As shown in FIG. 3G, the through holes 17 are filled with a conductive material, thereby forming the first through wirings 18. The material and the forming method of the first through wirings 18 can be the same as those of the trench wirings 14.

Figure 3H:
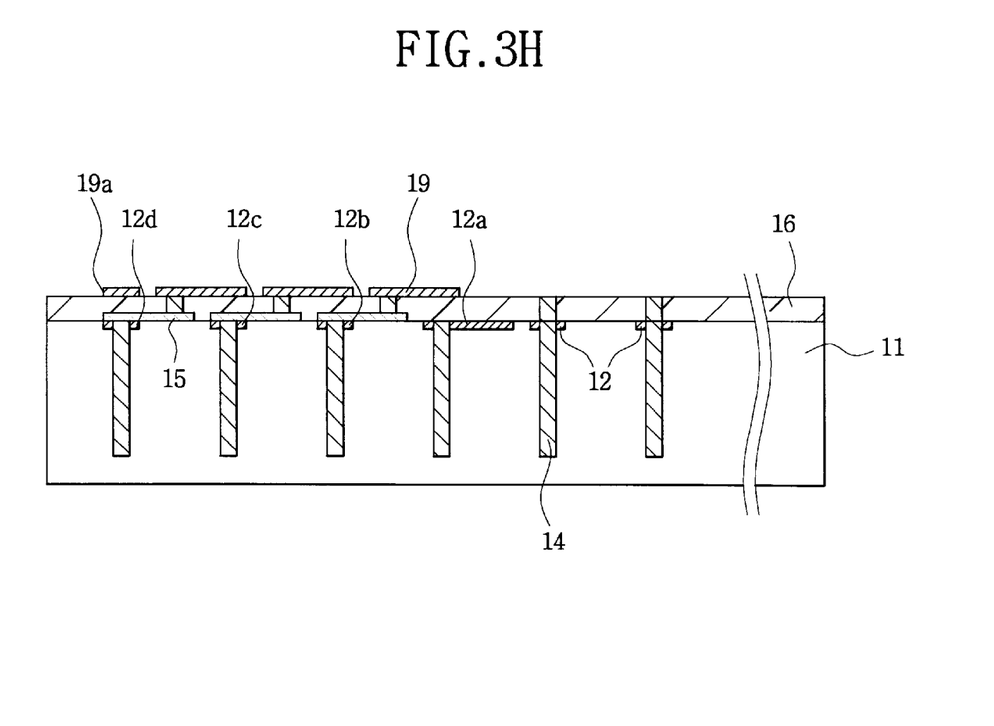

As shown in FIG. 3H, the second metal wirings 19, 19a are formed on the first insulation layer 16. The second metal wirings 19 are each connected to one of the chip selection pads 12b, 12c, 12d through the first metal wirings 15 within the first insulation layer 16, and the isolated second metal wiring 19a is disposed above the third chip selection pad 12d. The second metal wirings 19 are not formed above the chip terminals 12 and are laterally offset from the chip selection terminal 12a. The second metal wirings 19 extend toward the chip selection terminal 12a along the upper surface of the first insulation layer 16. Therefore, one of the second metal wirings 19 extends partly above and partly offset from the chip selection terminal 12a and the others extend above the chip selection pads 12b, 12c. The material and the forming method of the second metal wirings 19, 19a can be the same as those of the first metal wirings 15.

Figure 3I:
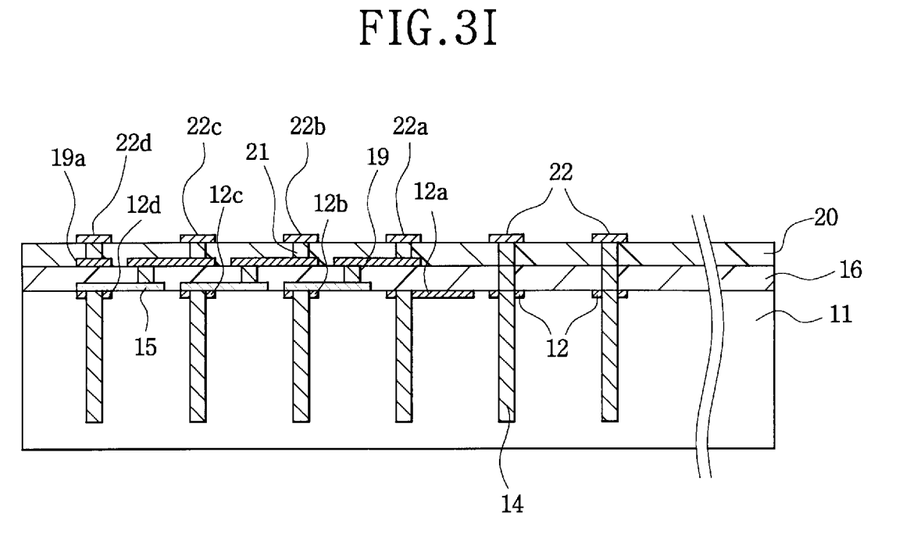

Then, similar to the steps in FIGS. 3E to 3G, the second insulation layer 20 is formed on the first insulation layer 16. Through holes extend through the second insulation layer 20 and are filled with a conductive material, thereby forming the second through wirings 21. As shown in FIG. 3I, the upper connection terminals 22, 22a, 22b, 22c, 22d are formed on the second insulation layer 20 and connected to the second through wirings 21. The upper connection terminals 22, 22a, 22b, 22c, 22d, each corresponds to one of the chip terminals 12, the chip selection terminal 12, and the chip selection pads 12b, 12c, 12d. The upper connection terminal 22 above the chip terminal 12 is connected directly to the chip terminal 12. The upper connection terminal 22a above the chip selection terminal 12a is not connected to the chip selection terminal 12a, but rather to the first chip selection pad 12b. Likewise, each of the upper connection terminals 22b, 22c above the chip selection pads 12b, 12c, respectively, is not connected to the chip selection pads 12b or 12c, but connected to the neighboring chip selection pads 12c, 12d. The outermost upper connection terminal 22d is connected to the isolated second metal wiring 19a.

Figure 3J:
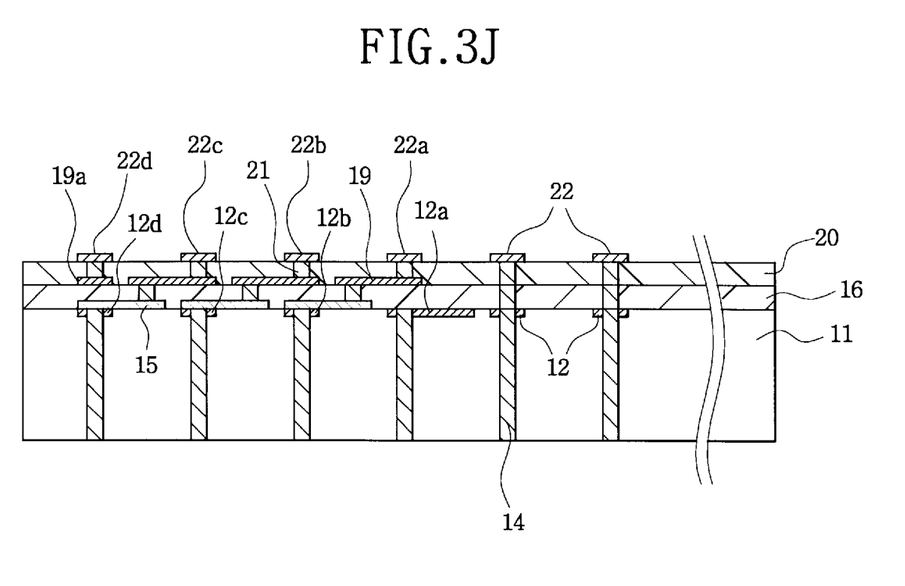

As shown in FIG. 3J, the lower surface of the die 11 is partially removed by a conventional etching method or a conventional grinding method such as wafer back lapping, so that the trench wirings 14 are exposed through the lower surface of the die 11.

Figure 3K:
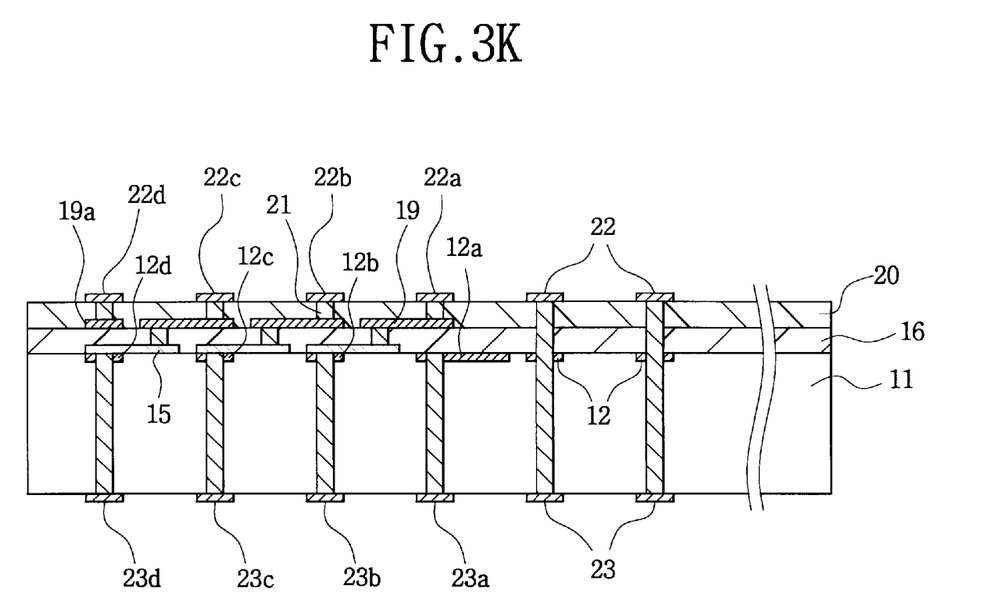

As shown in FIG. 3K, lower connection terminals 23, 23a, 23b, 23c, 23d are formed on the lower surface of the die 11 so as to be electrically connected to the trench wirings 14. Therefore, each of the lower connection terminals 23, 23a, 23b, 23c, 23d is connected to a corresponding one of the chip terminals 12, the chip selection terminal 12a, and the chip selection pads 12b, 12c, 12d through the trench wirings 14.

The semiconductor integrated circuit chip 10 in FIG. 2 is manufactured by the above-described processing steps. A plurality of the chips are stacked, and the upper connection terminals of a lower chip are attached to the lower connection terminals of an upper chip, thus obtaining the multi-chip package 100 in FIG. 1. Since each chip of the multi-chip package has the same structure, plural chips at the wafer-level can be collectively manufactured and separated into individual chips.

Figure 4:
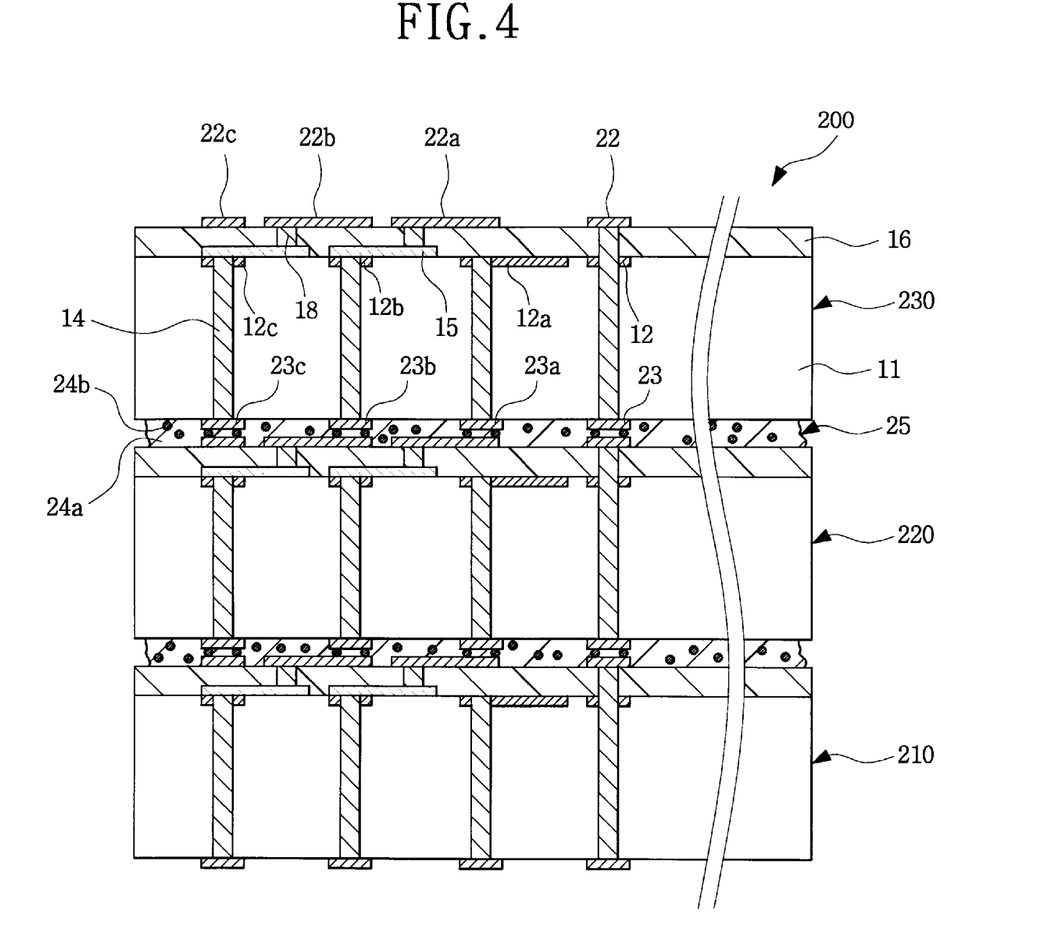
FIG. 4 is a cross-sectional view of a three-dimensional, multi-chip package in accordance with another embodiment of the present invention.

The second metal wirings of the above-described first embodiment of the present invention may be used as the upper connection terminals. Further, in stacking the chips, an adhesive layer or an anisotropic conductive film may be interposed between the chips. FIG. 4 is a cross-sectional view of a chip-level, three-dimensional, multi-chip package 200 in accordance with another embodiment of the present invention.

In accordance with the second embodiment of the present invention, the multi-chip package 200 comprises three (3) integrated circuit chips 210, 220, 230. Therefore, each of the chip 210, 220, 230 comprises two (2) chip selection pads 12b, 12c. The insulation layer 16 is formed on the upper surface of the die 11, and the metal wirings 15 connected to the chip selection pads 12b, 12c are formed within the insulation layer 16. Then, through holes extend through the insulation layer 16 to expose a portion of the metal wirings 15 and are filled with a conductive material, thereby forming the through wirings 18.

The through wirings 18 are connected to the upper connection terminals 22a, 22b on the insulation layer 16. The upper connection terminal 22 is disposed above the chip terminal 12, and the isolated upper connection terminal 22c is disposed above the outermost chip selection pad 12c. The chip selection pad 12a is not connected to any of the upper connection terminals 22, 22a, 22b, 22c. The lower connection terminals 23, 23a, 23b, 23c are formed on the lower surface of the die 11 correspondingly to the upper connection terminals 22, 22a, 22b, 22c. Each of the chip terminal 12, the chip selection terminal 12a, and the chip selection pads 12b, 12c is connected to a corresponding one of the lower connection terminals 23, 23a, 23b, 23c through the trench wirings 14.

The chips 210, 220, 230 can be stacked using an Anisotropic Conductive Film (ACF) or an Anisotropic Conductive Adhesive (ACA). The ACF 25 or the ACA comprises an insulation film 24a or an insulating adhesive, and conductive particles 24b dispersed within the insulation film 24a or the insulating adhesive. As the insulation film 24a or the insulation adhesive is compressed by the upper connection terminals 22, 22a–22c of a lower chip and the lower connection terminals 23, 23a–23c of an upper chip, the upper connection terminals 22, 22a –22c and the lower connection terminals 23, 23a–23c are electrically interconnected by the conductive particles 24b. Thereby, the insulation film 24a or the insulation adhesive attaches the chip to another chip. Instead of the ACF 25 or the ACA, other various insulation adhesives may be used as an adhesion layer.

In the above-described multi-chip package 200 of the second embodiment, the chip selection terminal 12a of each chip 210, 220, 230 is separated from the chip selection terminal 12a of another chip and connected to a corresponding one of the lower connection terminals 23a–23c of the lowermost chip 210.

In the multi-chip package of the present invention, the chip selection terminal of each chip is separated from the chip selection terminal of another chip by the chip selection pads formed on the chip. Therefore, the multi-chip package of the present invention does not require differently structured chips or any additional substrate. Accordingly, the present invention achieves the chip-level multi-chip package, using a simple process.

The wafer-level multi-chip package of the present invention reduces package size and increases mounting density, thereby minimizing signal delay.

Although the preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A three-dimensional, multi-chip package formed by stacking a number (N) of semiconductor integrated circuit chips, each chip comprising:
   an integrated circuit die having an upper surface and a lower surface;
   a chip selection terminal formed on the upper surface of said die;
   a number (N−1) of chip selection pads formed on the upper surface of said die proximate to said chip selection terminal;
   an insulation layer formed on the upper surface;
   a number (N−1) of first metal wirings formed within said insulation layer, each of said first metal wirings connected to a corresponding one of said chip selection pads;
   upper connection terminals formed on said insulation layer and connected to said first metal wirings;
   lower connection terminals formed on the lower surface of said die corresponding to said upper connection terminals; and
   trench wirings formed through said die, said trench wirings connecting said chip selection terminal or said chip selection pads to said lower connection terminals,
   wherein among said chip selection pads, a first chip selection pad next to said chip selection terminal is connected to the upper connection terminal formed above said chip selection terminal, and the (N−1)th chip selection pad is connected to the upper connection terminal formed above the (N−2)th chip selection pad, and
   wherein said chips are stacked by attaching said upper connection terminals of a lower chip to said lower connection terminals of an upper chip, and said chip selection terminal of each chip is connected to a corresponding one of said lower connection terminals of a lowermost chip.

2. The multi-chip package of claim 1, wherein said die is one of a plurality of integrated circuit dies formed on a wafer.

3. The multi-chip package of claim 1, wherein said die is an integrated circuit die separated from a wafer.

4. The multi-chip package of claim 1, wherein said die is a memory chip.

5. The multi-chip package of claim 1, wherein each chip further comprises second metal wirings formed on said insulation layer, said second metal wirings for connecting said first metal wirings to said upper connection terminals.

6. The multi-chip package of claim 1, wherein said upper connection terminal formed above said (N−1)th chip selection pad is electrically isolated.

7. The multi-chip package of claim 1, further comprising adhesive layers, each adhesive layer being interposed between a lower chip and an upper chip.

8. The multi-chip package of claim 1, further comprising Anisotropic Conductive Film (ACF) or Anisotropic Conductive Adhesive (ACA), each ACF or each ACA being interposed between a lower chip and an upper chip.

9. A method for manufacturing a three-dimensional multi-chip package formed by stacking a number (N) of semiconductor integrated circuit chips, said method comprising:
   (a) forming a chip selection terminal and a number (N−1) of chip selection pads proximate to said chip selection terminal on an upper surface of said chip;
   (b) forming a plurality of trenches from said chip selection terminal and said chip selection pads within said chip;
   (c) forming trench wirings by filling said trenches with a conductive material;
   (d) forming a number (N−1) of first metal wirings along said upper surface of the chip, each of said first metal wirings being connected to a corresponding one of said chip selection pads;
   (e) forming a first insulation layer on said upper surface of the chip and said first metal wirings;
   (f) forming a plurality of upper connection terminals connected to said first metal wirings on said first insulation layer;
   (h) forming a plurality of lower connection terminals on said lower surface of the chip, each of said lower connection terminals connected to a corresponding one of said trench wirings; and
   (i) stacking said chips by attaching said upper connection terminals of a lower chip to said lower connection terminals of an upper chip.

10. The method of claim 9, wherein said step (f) comprises:
   (f-1) forming a plurality of through holes by removing a portion of said first insulation layer, each of said through holes for exposing a portion of corresponding one of said first metal wirings;
   (f-2) forming through wirings by filling said through holes with a conductive material; and
   (f-3) forming upper connection terminals connected to a corresponding one of said through wirings on said first insulation layer.

11. The method of claim 9, wherein said step (f) comprises:
   (f-4) after forming a plurality of through holes by removing a portion of said first insulation layer, forming first through wirings by filling said through holes with a conductive material, said through hole for exposing a portion of a corresponding one of said first metal wirings;
   (f-5) forming second metal wirings connected to said first through wirings on said first insulation layer;
   (f-6) forming a second insulation layer on said second metal wirings;
   (f-7) after forming a plurality of through holes by removing a portion of said second insulation layer, forming second through wirings by filling said through holes with a conductive material, said through hole for exposing a portion of corresponding one of said second metal wirings; and
   (f-8) forming upper connection terminals connected to a corresponding one of said second through wirings on said second insulation layer.

12. The method of claim 9, wherein the step (i) further comprises interposing adhesive layers between the chips.

13. The method of claim 9, wherein the step (i) further comprises interposing Anisotropic Conductive Film (ACF) or Anisotropic Conductive Adhesive (ACA) between the chips.

14. The method of claim 9, further comprising:
   (g) grinding the lower surface of said chip so that said trench wirings are exposed through said lower surface of the chip.

* * * * *